United States Patent
Liu

(10) Patent No.: US 6,947,284 B2
(45) Date of Patent: Sep. 20, 2005

(54) HEAT SINK ASSEMBLY WITH RETAINING DEVICE

(75) Inventor: HeBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 182 days.

(21) Appl. No.: 10/658,025

(22) Filed: Sep. 8, 2003

(65) Prior Publication Data

US 2004/0085735 A1 May 6, 2004

(30) Foreign Application Priority Data

Nov. 20, 2002 (TW) ........................................ 91218635 U

(51) Int. Cl.⁷ ................................................. H05K 7/20
(52) U.S. Cl. ........................ 361/704; 24/458; 165/80.3; 165/185; 248/505; 248/510; 361/710; 361/719; 257/719
(58) Field of Search ............................... 165/80.2, 80.3, 165/185; 24/295–296, 457–458; 248/271, 505, 510; 257/706–727; 361/704–710, 719–720

(56) References Cited

U.S. PATENT DOCUMENTS

| | | | | |
|---|---|---|---|---|
| 5,586,005 A | * | 12/1996 | Cipolla et al. | ............... 361/719 |
| 6,208,515 B1 | * | 3/2001 | Klein | ........................... 361/704 |
| 6,400,577 B1 | * | 6/2002 | Goodwin et al. | ........... 361/816 |
| 6,412,546 B1 | * | 7/2002 | Lin et al. | .................... 165/80.3 |
| 6,549,412 B1 | * | 4/2003 | Ma | .............................. 361/704 |
| 6,611,431 B1 | * | 8/2003 | Lee et al. | .................... 361/719 |
| 6,621,704 B1 | * | 9/2003 | Liu | ............................. 361/704 |

* cited by examiner

Primary Examiner—Gregory Thompson
(74) Attorney, Agent, or Firm—Wei Te Chung

(57) ABSTRACT

A heat sink assembly includes a heat sink (30), a retention frame (10), a rectangular fastener (50), four pins (20), and four springs (40). The heat sink includes a base (32) defining four bores (38) therein. The frame is secured to a printed circuit board (60) around an electronic package (70), and defines a pair of screw holes (16). The pins are received through the bores of the base and in the fastener. The springs surround the pins respectively between the base and the fastener. A pair of posts (90) is extended through positioning holes defined in the fastener and the through holes of the heat sink, and engaged in the screw holes of the frame, thereby securing the fastener to the retention frame with the spring members pressing toward the base. The heat sink is thus easily, firmly and evenly secured to the electronic package.

13 Claims, 2 Drawing Sheets

HEAT SINK ASSEMBLY WITH RETAINING DEVICE

CROSS-REFERENCE TO RELATED APPLICATION

This application is related to the copending U.S. patent application Ser. No. 10/346,968 filed Jan. 17, 2003 having the same title, the same applicant and the same assignee with the instant invention, and whose disclosure is incorporated by reference herein.

BACKGROUND OF THE INVENTION

1. Field of the Invention

The present invention relates to heat sinks and their retention on heat-generating devices such as electronic packages, and more particularly to a heat sink assembly having a retaining device securely retaining a heat sink on a heat-generating device.

2. Description of Prior Art

Numerous modern electronic devices such as central processing units (CPUs) of computers generate large amounts of heat during operation. The heat must be efficiently removed from the CPU; otherwise, abnormal operation or damage may result. Typically, a retaining device attaches a heat sink on the CPU to remove heat therefrom.

A common kind of retaining device comprises a retention frame and a clip. The retention frame is mounted on a printed circuit board (PCB), and surrounds a CPU that is also mounted on the PCB. The retention frame forms a pair of ears at opposite sides thereof. The clip comprises a central pressing portion pressing a heat sink onto the CPU, and a pair of clamping legs depending from opposite ends of the pressing portion. The legs each define an opening therein, the openings of the legs engagingly receiving the ears of the retention frame. Thus, the heat sink is resiliently attached on the CPU to remove heat therefrom.

With the rapid development of the electronics technology, CPUs are now able to process signals at unprecedented high speeds. As a result, CPUs can generate huge amounts of heat. To maintain an acceptably low operating temperature of a high-speed CPU, a heat sink must have great heat dissipation capability. A popular way to achieve this is to simply provide heat sinks that are larger and heavier than their predecessors. However, many conventional retaining devices are not strong enough to securely retain a large, heavy heat sink on the CPU. The heat sink is liable to shift relative to the CPU when the assembly is subjected to vibration or shock during use. This can adversely affect the efficiency of heat removal. The heat sink may even disengage from the CPU altogether.

SUMMARY OF THE INVENTION

Accordingly, an object of the present invention is to provide a heat sink assembly having a retaining device which easily and securely fastens a heat sink on a heat-generating device such as an electronic package.

A further object of the present invention is to provide a heat sink assembly which has a retaining device adjustable to adapt to different applications.

In order to achieve the objects set out above, a heat sink assembly in accordance with a preferred embodiment of the present invention comprises a heat sink a retention frame, a rectangular fastener, four pins, and four springs. The heat sink includes a base defining four bores therein. The frame is secured to a printed circuit board around an electronic package, and defines a pair of screw holes. The pins are received through the bores of the base and in the fastener. The springs surround the pins respectively between the base and the fastener. A pair of posts is extended through positioning holes defined in the fastener and the through holes of the heat sink, and engaged in the screw holes of the frame, thereby securing the fastener to the retention frame with the spring members pressing toward the base. The heat sink is thus easily, firmly and evenly secured to the electronic package.

Other objects, advantages and novel features of the present invention will become more apparent from the following detailed description when taken in conjunction with the accompanying drawings, in which:

DETAILED DESCRIPTION OF THE INVENTION

Figure 1:
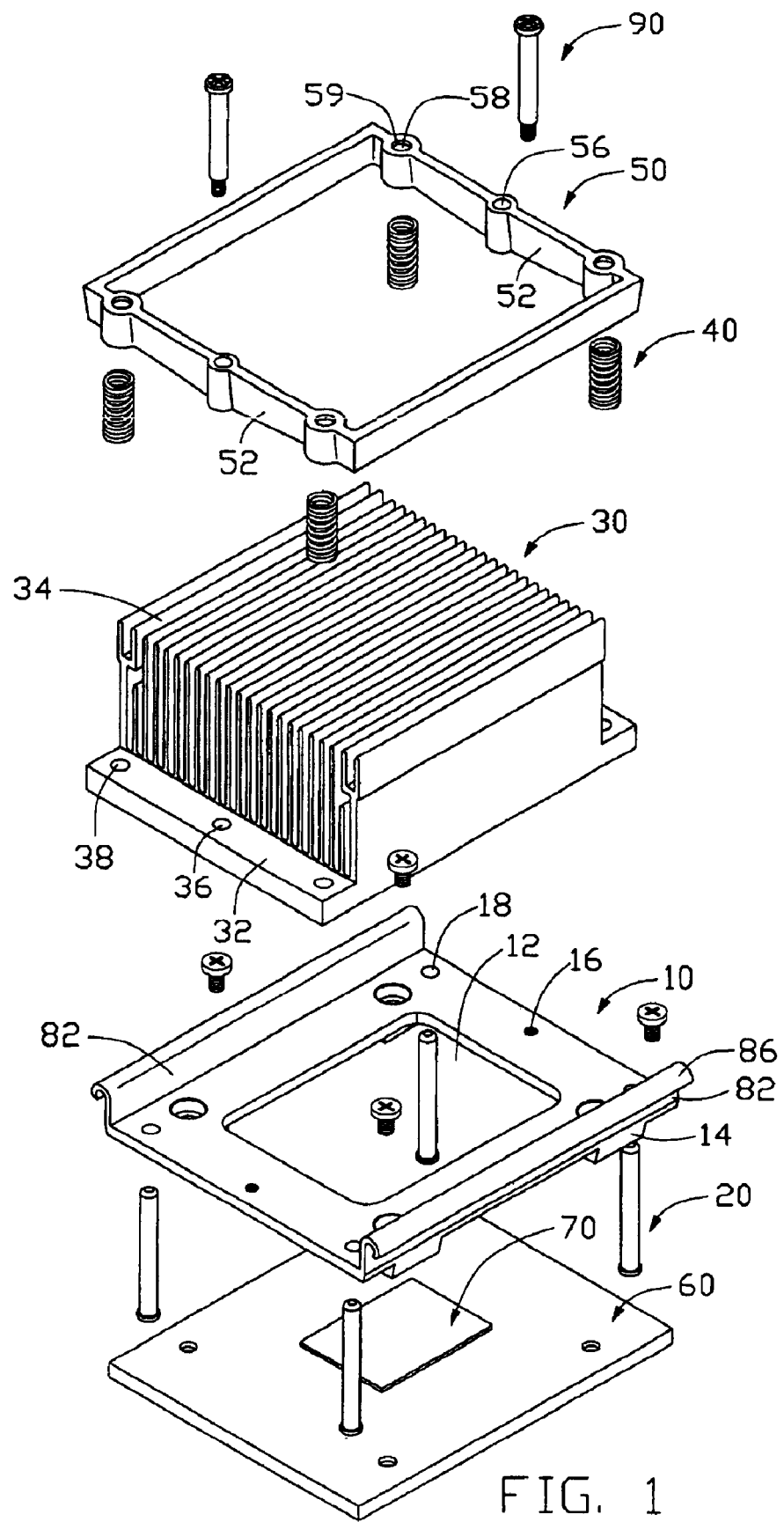
FIG. 1 is an exploded, isometric view of a heat sink assembly having a retaining device in accordance with the preferred embodiment of the present invention, together with an electronic package mounted on a printed circuit board (PCB)

Referring to FIG. 1, a heat sink assembly having a retaining device in accordance with the preferred embodiment of the present invention comprises a retention frame 10, four pins 20, a heat sink 30, four springs 40 and a fastener 50. The retaining device fastens the heat sink 30 to an electronic package 70 that is mounted on a printed circuit board (PCB) 60. The electronic package 70 may for example be an integrated circuit (IC) package directly soldered on the PCB 60.

The heat sink 30 comprises a base 32, and a plurality of parallel fins 34 extending upwardly from the base 32. The base 32 comprises two exposed side portions at respective opposite sides of the plurality of fins 34. A through hole 36 is defined in a middle of each said side portion. A pair of first bores 38 is defined in respective opposite ends of each said side portion, for insertion of corresponding pins 20 therethrough.

The retention frame 10 can be secured to the PCB 60 by a plurality of fastening means such as screws (not labeled). A rectangular opening 12 is defined in a central portion of the retention frame 10 for receiving the electronic package 70 therein. A pair of standoffs 14 depends from respective opposite ends of each of opposite sides of the retention frame 10, for contacting the PCB 60 and supporting the retention frame 10 thereon. Four second bores 18 are defined in four corners of the retention frame 10 respectively, for insertion of the pins 20 therethrough. A pair of flanges 82 extends upwardly from respective opposite side edges of the retention frame 10, for facilitating positioning of the heat sink 30 on the retention frame 10. Each flange 82 outwardly forms a ridge 86 at an upper edge thereof. A pair of screw holes 16 is defined in the retention frame 10 at respective opposite sides of the opening 12. Each screw hole 16 lies equidistantly between the opposite flanges 82.

The fastener 50 is integrally formed as a single frame-like piece. The fastener 50 comprises a pair of opposite end walls 52. A pair of locating holes 58 is defined in respective opposite ends of each end wall 52. An annular step 59 is integrally formed in each end wall 52 inside each locating hole 58. A positioning hole 56 is defined in a middle of each end wall 52 between the locating holes 58, for insertion of a corresponding post 90 therethrough. Each post 90 has a threaded distal end for engaging in a corresponding screw hole 16, thereby attaching the fastener 50 to the retention frame 10.

Figure 2:
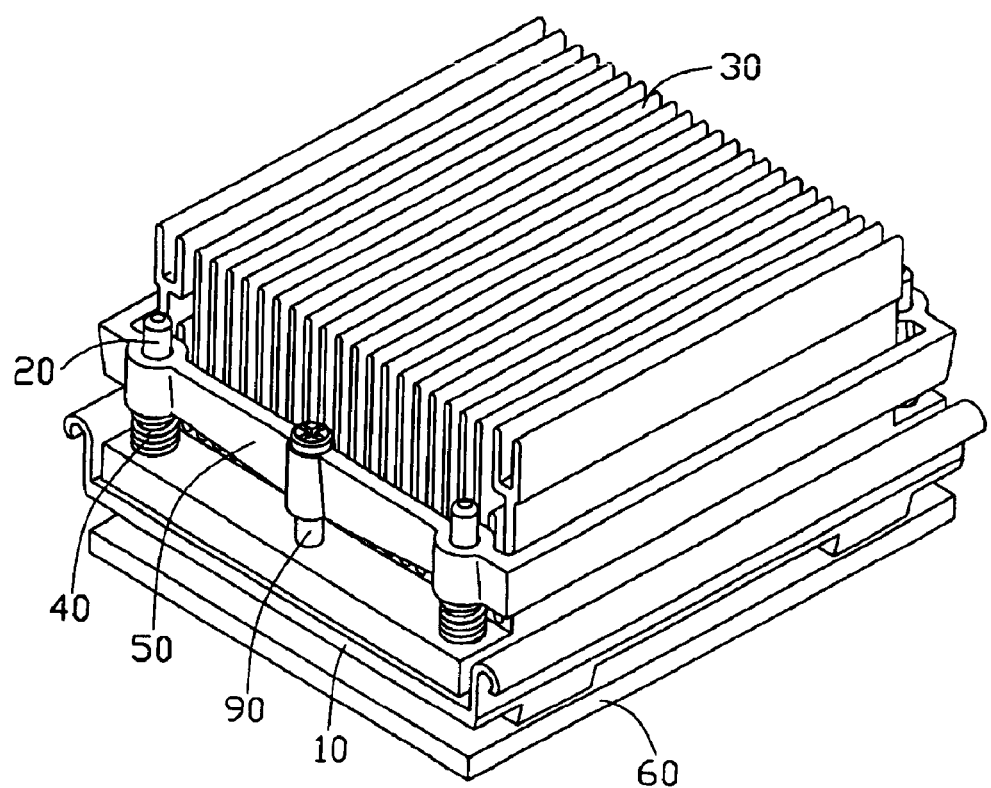
FIG. 2 is an assembled view of FIG. 1.

Referring also to FIG. 2, in assembly, the pins 20 are fittingly inserted through the second bores 18 of the retention frame 10. Then the retention frame 10 is secured to the PCB 60 with the screws (not labeled). The CPU 70 is thus received in the opening 12 of the retention frame 10. The heat sink 30 is placed between the flanges 82 of the retention frame 10, with the pins 20 inserting through the first bores 38 of the heat sink 30. The heat sink 30 is thus positioned on the retention frame 10.

The springs 40 are placed over portions of the pins 20 that protrude above said side portions of the base 32 of the heat sink 30. The fastener 50 is mounted on the heat sink 30 around the fins 34. The locating holes 58 of the fastener 50 are aligned with the pins 20. The posts 90 are inserted through the positioning holes 56 and through holes 36, and engaged in the screw holes 16 of the retention frame 10. Simultaneously, the pins 20 are fittingly received through the locating holes 58 of the fastener 50. The springs 40 are thus sandwiched between said side portions of the base 32 and the steps 59 of the fastener 50. The springs 40 cooperatively provide evenly distributed pressing forces on the base 32. In addition, the pins 20 prevent transverse movement of the heat sink 30 relative to the electronic package 70. The heat sink 30 is thus easily, firmly and evenly secured to the electronic package 70. If needed, the pressing forces on the base 32 can be adjusted by adjusting the extent to which the posts 90 are engaged in the screw holes 16. This enables the heat sink assembly to be readily adapted to different applications.

In disassembly, the posts 90 are disengaged from the screw holes 16. The heat sink 30 is then easily and safely detached from the electronic package 70.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
a heat sink comprising a base defining a plurality of bores therein;
a retention frame adapted to be secured to a printed circuit board, the frame defining a pair of screw holes therein;
a fastener placed on the heat sink and defining a pair of positioning holes;
a plurality of pins received through the bores of the base and in the fastener; and
a plurality of spring members respectively surrounding the pins between the base and the fastener; and
a pair of posts received through the positioning holes and engaged in the screw holes of the retention frame, thereby securing the fastener to the retention frame with the spring members pressing toward the base.

2. The assembly of claim 1, wherein the bores are defined in the base at respective opposite sides of the plurality of fins.

3. The assembly of claim 2, wherein two pairs of locating holes are defined in the fastener, and each pair of locating holes is disposed at opposite sides of a corresponding positioning hole.

4. The assembly of claim 3, wherein the pins are fittingly received in the locating holes of the fastener.

5. The assembly of claim 1, wherein a pair of through holes is defined in the base of the heat sink in alignment with the positioning holes respectively, for receiving the posts therethrough.

6. A heat sink assembly comprising:
a printed circuit board;
an electronic package mounted on the printed circuit board;
a retention frame mounted on the printed circuit board and surrounding the electronic package;
a heat sink engaged on the electronic package;
a fastener located around the heat sink and downwardly pressing the heat sink via resilient means; and
posts attaching the fastener to the retention frame so that the heat sink is resiliently engaged on the electronic package.

7. The assembly of claim 6, wherein the posts extend through both the fastener and the heat sink.

8. The assembly of claim 6, wherein a plurality of pins extends through the retention frame, the heat sink and the fastener for preventing transverse movement of the heat sink relative to the electronic package.

9. The assembly of claim 8, wherein said resilient means comprises a plurality of springs located around the pins.

10. The assembly of claim 6, wherein the retention frame defines an opening receiving the electronic package therethrough.

11. The assembly of claim 6, wherein the electronic package is an integrated circuit chip directly soldered on the printed circuit board.

12. A heat sink assembly comprising:
a printed circuit board;
an electronic package sub-assembly mounted on the printed circuit board;
a retention frame mounted on the printed circuit board and surrounding said electronic package sub-assembly;
a heat sink seated upon the electronic sub-assembly;
a fastener located above said heat sink and downwardly pressing the heat sink via resiliency means; and
an attachment device including two opposite ends respectively engaged with the fastener and the retention frame when said resiliency means is in tensioned status whereby said heat sink resiliently abuts downwardly against the electronic package thereunder.

13. The assembly of claim 12, wherein said attachment device is fixed to the retention frame while is moveable relative to the fastener in a vertical direction when said resiliency means is further compressed.

* * * * *